(12) United States Patent
Takasu

(10) Patent No.: US 8,587,051 B2
(45) Date of Patent: Nov. 19, 2013

(54) NONVOLATILE SEMICONDUCTOR MEMORY DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 66 days.

(21) Appl. No.: 13/374,142

(22) Filed: Dec. 13, 2011

(65) Prior Publication Data

US 2012/0153375 A1    Jun. 21, 2012

(30) Foreign Application Priority Data

Dec. 21, 2010  (JP) ................... 2010-284998
Dec. 21, 2010  (JP) ................... 2010-285000
Nov. 16, 2011  (JP) ................... 2011-250298

(51) Int. Cl.
*H01L 29/788* (2006.01)
(52) U.S. Cl.
USPC ........... 257/316; 257/314; 257/315; 257/320; 257/321; 257/390; 438/257; 438/258; 438/259; 438/264

(58) Field of Classification Search
None
See application file for complete search history.

(56) References Cited

U.S. PATENT DOCUMENTS 5,656,838 A * 8/1997 Shinmori ................... 257/315

FOREIGN PATENT DOCUMENTS

JP          01160058        6/1989

* cited by examiner

*Primary Examiner* — Kyoung Lee
(74) *Attorney, Agent, or Firm* — Adams & Wilks

(57) ABSTRACT

Provided is an electrically erasable and programmable nonvolatile semiconductor memory device whose tunnel region formed in the drain region has the second conductivity-type low-impurity-concentration region with the first tunnel insulating film for solely injecting electrons disposed thereon, and the first conductivity-type low-impurity-concentration region with the second tunnel insulating film for solely ejecting electrons disposed thereon, both regions fixed to the same potential as the drain region and having a lower impurity concentration than that of the drain region.

16 Claims, 7 Drawing Sheets

NONVOLATILE SEMICONDUCTOR MEMORY DEVICE

BACKGROUND OF THE INVENTION

1. Field of the Invention

The present invention relates to an electrically erasable and programmable nonvolatile semiconductor memory device.

2. Description of the Related Art

A basic unit of an electrically erasable and programmable nonvolatile semiconductor memory (hereinafter referred to as an EEPROM) is a memory cell whose structure is as follows: an N-type source region and a N-type drain region disposed on both side of a channel region and both disposed on a P-type silicon substrate; a tunnel region disposed on a part of the drain region; a floating gate electrode formed on a tunnel insulating film formed of a thin silicon oxide film or a complex film of a silicon oxide film and a silicon nitride film having a thickness equal to or less than a hundred angstrom; and a control gate electrode formed on a control insulating film formed of a thin insulating film and having a strong capacitive coupling with the floating gate electrode. The floating gate electrode is isolated electrically from the circumference and is capable of storing electric charges inside of it.

The floating gate electrode and the control gate electrode are both extended upon the channel region, and the conductance of the channel region varies according to the potential of the floating gate electrode. Accordingly change of the electric charges in the floating gate electrode corresponds to a nonvolatile memory of information. Application of a voltage of about 15 volts or more to the drain region and also to the tunnel region against the control gate electrode generates a tunnel current which ejects electrons stored in the floating gate electrode to the drain region through the tunnel insulating film formed in the tunnel region, and it is also possible to inject electrons into the floating gate electrode vice versa.

As described above change of the electric charge in the floating gate causes the functions as a nonvolatile memory. A lot of memory cells having such functions can be configured in columns and rows to form a memory array to have a large volume nonvolatile semiconductor memory device.

At this point the tunnel region having the tunnel insulating film through which electrons transport is especially important. On one hand the tunnel insulating film enables a quite lot of program/erase cycles up to some hundred thousands times, and on the other hand it plays a dominant role against the demand for long term storage of memory information (retention of the electric charges) for a few decades.

As an improvement in reliability of the tunnel region and the tunnel insulating film, a device in which a tunnel region having a different impurity concentration is formed next to the drain region to improve the program/erase characteristic (endurance characteristic) or the retention characteristic is proposed as in, for example, Japanese Patent Publication H01-160058A.

SUMMARY OF THE INVENTION

The above-mentioned improvement of the semiconductor device in which a special tunnel region is formed independently from the drain region has a problem of increase in the occupation area which leads to an increase in cost and still a problem of insufficient reliability for carrying out many more program/erase cycles over some hundred thousands times to some millions times.

It is an object of the present invention to provide an electrically erasable and programmable nonvolatile semiconductor memory device having a high reliability caused by suppression of degradation of the tunnel insulating film without increasing the occupation area.

In order to solve the above-mentioned problems an electrically erasable and programmable nonvolatile semiconductor memory device according to the present invention includes:

a first conductivity-type semiconductor substrate;

a second conductivity-type source region and a drain region disposed apart to face each other on a surface of the semiconductor substrate;

a channel formation region sandwiched by the source region and the drain region, formed on the surface of the semiconductor substrate;

a floating gate electrode disposed on a gate insulating film over the source region, the drain region and the channel region;

a control gate electrode disposed on a control insulating film over the floating gate electrode and capacitively coupled to the floating gate electrode; and an injection region for solely injecting electrons into the floating gate electrode from the drain region and an ejection region for solely ejecting electrons from the floating gate electrode to the drain region, both disposed between the floating gate electrode and the drain region, each of the injection region and the ejection region having a tunnel insulating film, the injection region and the ejection region being distinguished by having a region of a different conductivity-type in a part of one of the floating gate electrode and the drain region.

In one aspect the injection region of the electrically erasable and programmable nonvolatile semiconductor memory device has a second conductivity-type region disposed on the drain region, fixed to the same potential as the drain region, having a lower impurity concentration than that of the drain region and a first tunnel insulating film disposed thereon, and the ejection region has a first conductivity-type region disposed on the drain region, fixed to the same potential as the drain region, having a lower impurity concentration than that of the drain region and a second tunnel insulating film disposed thereon.

In another aspect the injection region of the electrically erasable and programmable nonvolatile semiconductor memory device has a first conductivity-type low-impurity-concentration floating gate electrode electrically connected to the floating gate electrode and a first tunnel insulating film disposed thereon, and the ejection region has a second conductivity-type low-impurity-concentration floating gate electrode electrically connected to the floating gate electrode and a second tunnel insulating film disposed thereon.

As described above, since the regions of the tunnel insulating film for transporting electrons can be distinguished in the case when the electrons are injected into the floating gate electrode from the drain region and in the case when the electrons are ejected from the floating gate electrode to the drain region, the total amount of the electrons passing through each of the tunnel insulating films can be made half of a conventional device, preventing degradation of the tunnel insulating films.

Accordingly suppression of the degradation of the tunnel insulating film, which gives marked effect to the endurance and retention characteristics of an electrically erasable and programmable nonvolatile semiconductor memory device, permits realization of a highly reliable electrically erasable and programmable nonvolatile semiconductor memory device.

DETAILED DESCRIPTION OF THE PREFERRED EMBODIMENT

Hereinafter, an electrically erasable and programmable nonvolatile semiconductor memory device according to the present invention is described with reference to the drawings for different embodiments.

1. First Embodiment

Figure 1:
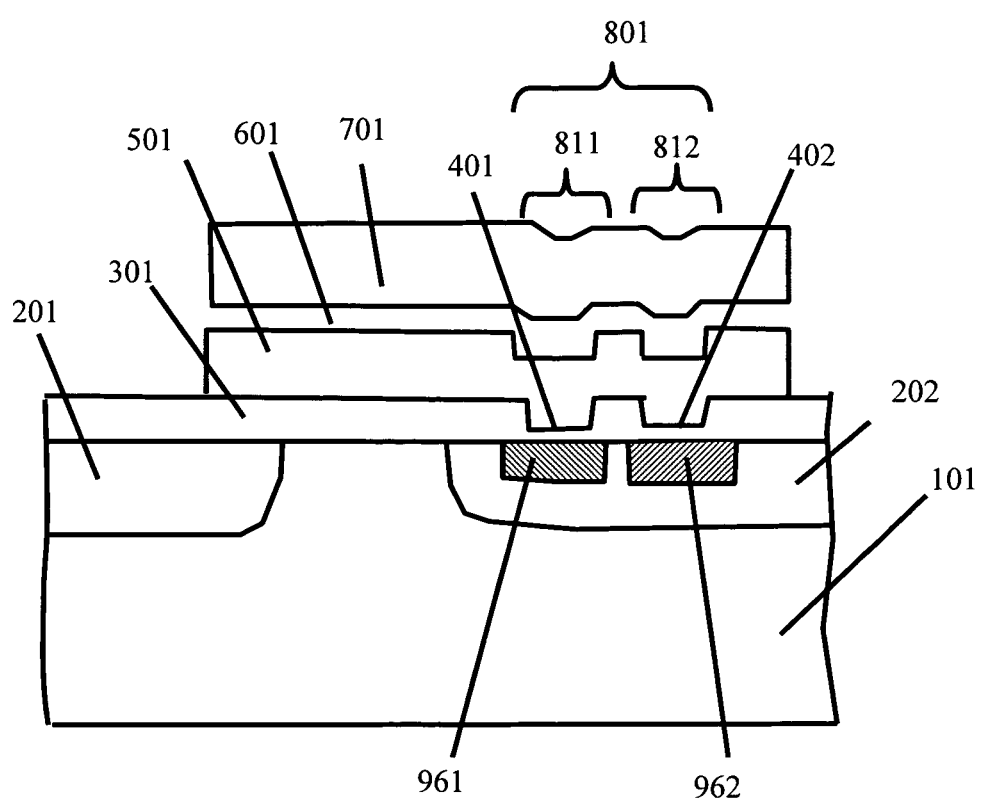
FIG. 1 shows a cross-sectional view illustrating the first embodiment of an electrically erasable and programmable nonvolatile semiconductor memory device according to the present invention.

FIG. 1 shows a cross-sectional view illustrating the first embodiment of an electrically erasable and programmable nonvolatile semiconductor memory device according to the present invention; a source region 201 and a drain region 202 of the second conductivity-type, which is N-type in this case, are formed apart to face each other on a surface of the semiconductor substrate of the first conductivity-type, which is P-type in this case, to define a channel region on the surface of the semiconductor substrate between the source region and the drain region; a floating gate electrode 501, which is formed from polycrystalline silicon or the like, is disposed on a gate insulating film 301, which is formed, for example, from silicon oxide film and having a thickness of 400 angstrom, over the source region, the drain region and the channel region; a control gate electrode 701, which is formed from polycrystalline silicon or the like, is disposed on a control insulating film, which is formed from a silicon oxide film, a silicon nitride film or a complex film of these films, over the floating gate electrode 501 to have a capacitive coupling with it.

On the surface of the tunnel region 801 in the drain region 202 an N-type low-impurity-concentration region 961 whose impurity concentration is low and a P-type low-impurity-concentration region 962 whose impurity concentration is also low are formed apart to each other. On each surface of the N-type low-impurity-concentration region 961 and the P-type low-impurity-concentration region 962, a tunnel insulating film 401 for injecting electrons and a tunnel insulating film 402 for ejecting electrons, both of which are made from a silicon oxide film, a silicon nitride film or a complex film of these films and having a thickness of about 80 angstrom, are formed respectively. The N-type low-impurity-concentration region 961, the tunnel insulating film 401 for injecting electrons and the floating gate electrode above it define an injection region 811; the P-type low-impurity-concentration region 962, the tunnel insulating film 402 for ejecting electrons, and the floating gate electrode above it define an ejection region 812.

In this configuration the N-type low-impurity-concentration region 961 and the P-type low-impurity-concentration region 962 in the drain region 202 are connected with the drain region to have nearly the same potential. Further both the N-type low-impurity-concentration region 961 and the P-type low-impurity-concentration region 962 have an impurity concentration of not more than $10^{16}$ atoms/cm$^3$. Still further at least one of the insulating films: the tunnel insulating film 401 for injecting electrons; the tunnel insulating film 402 for ejecting electrons; and the control insulating film 601, is made from a silicon oxide film, a silicon nitride film or a complex film of these films.

Next, operations for program/erase of data are explained. First, when electrons are to be injected from the drain region 202 into the floating gate electrode 501, the potential of the floating gate electrode 501 is held higher than that of the drain region 202. At this time the potential difference is fully applied to the tunnel insulating film 401, causing electron injection from the surface of the N-type low-impurity-concentration region 961 to the floating gate electrode 501 since the direction of the electric field causes accumulation of electrons at the surface region of the N-type low-impurity-concentration region 961 in the drain region 202.

On the other hand the potential difference is divided between the tunnel insulating film 402 for ejecting electrons and the depletion layer and a smaller voltage, which is obtained by subtracting a voltage applied to the depletion layer from the total voltage difference, is applied to the tunnel insulating film 402 since the direction of the electric field causes extension of the depletion layer at the surface of the P-type low-impurity-concentration region 962. Accordingly electrons are easily injected from the surface of the N-type low-impurity-concentration region 961 to the floating gate electrode 501, and hardly injected from the P-type low-impurity-concentration region 962 to the floating gate electrode 501. Electron injection from the drain region 202 to the floating gate electrode 501 is thus performed at the injection region 811, and no injection at the ejecting region 812.

Second, when electrons are to be ejected from the floating gate electrode 501 to the drain region 202, converse to the aforementioned injection from the drain region 202 into the floating gate electrode 501, ejection of electrons from the floating gate electrode 501 to the surface region of the N-type low-impurity-concentration region 961 is hardly permitted since the direction of the electric field causes depletion of electrons at the surface region of the N-type low-impurity-concentration region 961 in the drain region 202, a smaller voltage, which is obtained by subtracting a voltage applied to the depletion layer from the total voltage difference, is applied to the tunnel insulating film 401 the surface region of the N-type low-impurity-concentration region 961.

On the other hand the potential difference is fully applied to the tunnel insulating film 402 for ejecting electrons formed on the surface of the P-type low-impurity-concentration region 962 since the direction of the electric field causes accumulation of holes at the surface region of the P-type low-impurity-concentration region 962. Accordingly electrons are easily ejected from the floating gate electrode 501 to the surface of the P-type low-impurity-concentration region 962. Electron ejection from the floating gate electrode 501 to the drain region 202 is thus performed at the ejection region 812, and no ejection at the injecting region 811.

As described above the tunnel insulating films can be distinguished as the tunnel insulating film for electron injection 401 and the tunnel insulating film for electron ejection 402 in the case when the electrons are injected into the floating gate electrode from the drain region and in the case when the electrons are ejected from the floating gate electrode to the drain region, respectively, the total amount of the electrons passing through each of the tunnel insulating films can be made half of a conventional device, preventing degradation of the tunnel insulating films.

In this embodiment the N-type low-impurity-concentration region 961 and the P-type low-impurity-concentration region 962 are formed apart from each other in the drain region 202, and the tunnel insulating film for electron injection 401 and the tunnel insulating film for electron ejection 402 are formed on the N-type low-impurity-concentration region 961 and the P-type low-impurity-concentration region 962, respectively; the injection region and the ejection region are separated, permitting sure electron injection into the floating gate and electron ejection to the drain region by assigning roles to the tunnel insulating film at the respective location.

Further the impurity concentrations of the N-type low-impurity-concentration region 961 and the P-type low-impurity-concentration region 962 in the drain region 202 are not more than $10^{16}$ atoms/cm$^3$, respectively; the surfaces of both the regions can be easily depleted by the voltage difference between the drain region 202 and the floating gate electrode 501 at the time of program/erase of data. Still further at least one of the insulating films: the tunnel insulating film 401 for injecting electrons; the tunnel insulating film 402 for ejecting electrons; and the control insulating film 601, is made from a complex film of a silicon oxide film and a silicon nitride film, enabling advance in reliability.

2. Second Embodiment

Figure 2:
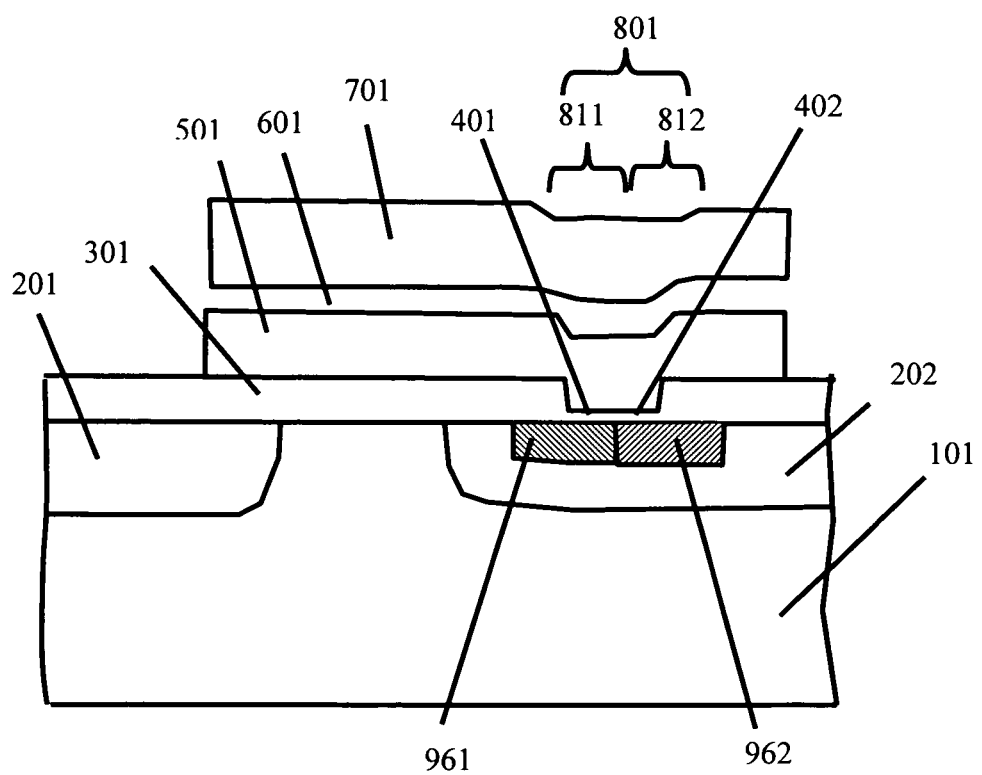
FIG. 2 shows a cross-sectional view illustrating the second embodiment of an electrically erasable and programmable nonvolatile semiconductor memory device according to the present invention.

FIG. 2 shows a cross-sectional view illustrating the second embodiment of an electrically erasable and programmable nonvolatile semiconductor memory device according to the present invention.

Differences to the first embodiment shown by FIG. 1 are as follows: the N-type low-impurity-concentration region 961 and the P-type low-impurity-concentration region 962 both in the drain region 202 are formed adjacent to each other; the tunnel insulating film 401 for injecting electrons and the tunnel insulating film 402 for ejecting electrons are formed in a common window as one peace extending over the N-type low-impurity-concentration region 961 and the P-type low-impurity-concentration region 962. Accordingly the injection region 811 and the ejection region 812 are placed continuously; the boundary between the regions locates over the junction at which the N-type low-impurity-concentration region 961 and the P-type low-impurity-concentration region 962 contact each other. Such configuration enables reduction of the occupation area. Explanation for other part of the structure having the same numeral as in FIG. 1 is omitted.

3. Third Embodiment

Figure 3:
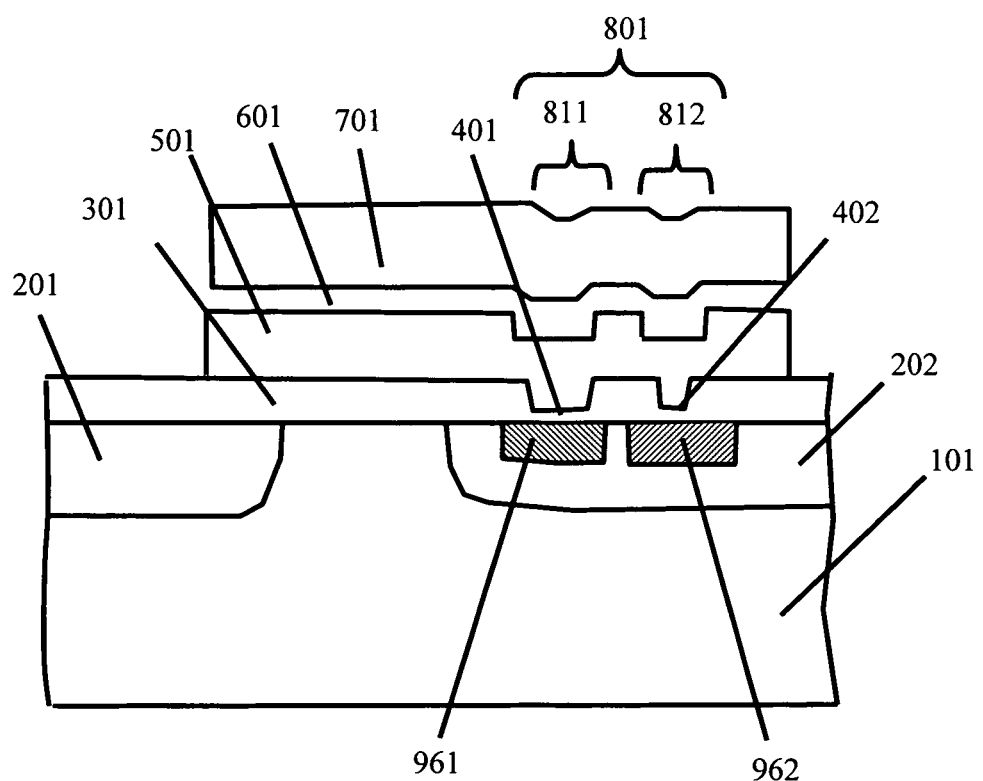
FIG. 3 shows a cross-sectional view illustrating the third embodiment of an electrically erasable and programmable nonvolatile semiconductor memory device according to the present invention.

FIG. 3 shows a cross-sectional view illustrating the third embodiment of an electrically erasable and programmable nonvolatile semiconductor memory device according to the present invention.

A source region 201 and a drain region 202 of the second conductivity-type, which is N-type in this case, are formed apart to face each other on a surface of the semiconductor substrate of the first conductivity-type, which is P-type in this case, to define a channel region on the surface of the semiconductor substrate between the source region and the drain region; a floating gate electrode 501, which is formed from polycrystalline silicon or the like, is disposed on a gate insulating film 301, which is formed, for example, from silicon oxide film and having a thickness of 400 angstrom, over the source region, the drain region and the channel region; a control gate electrode 701, which is formed from polycrystalline silicon or the like, is disposed on a control insulating film, which is formed from a silicon oxide film, a silicon nitride film or a complex film of these films, over the floating gate electrode 501 to have a capacitive coupling with it.

On the surface of the tunnel region 801 in the drain region 202 an N-type low-impurity-concentration region 961 and a P-type low-impurity-concentration region 962 are formed apart to each other. On each surface of the N-type low-impurity-concentration region 961 and the P-type low-impurity-concentration region 962, a tunnel insulating film 401 for injecting electrons and a tunnel insulating film 402 for ejecting electrons, both of which are made from a silicon oxide film, a silicon nitride film or a complex film of these films and having a thickness of about 80 angstrom, are formed respectively.

In this configuration the area of the tunnel insulating film 401 for injecting electrons formed on the surface of the N-type low-impurity-concentration region 961 is made larger than that of the tunnel insulating film 402 for ejecting electrons formed on the surface of the P-type low-impurity-concentration region 962. The injection region 811 is thus larger that the ejection region 812. The configuration works to prevent the generation of unbalanced stress which accelerate the degradation of the tunnel insulating film. The unbalanced stress is generated by a larger current passing through the unit area of the tunnel oxide performing injection of electrons into the floating gate 501, which is the tunnel insulating film 401 for injecting electrons, since the voltage applied between the floating gate electrode 501 and the drain region 202 for injecting electrons into the gate electrode 501 from the drain region 202, in which the potential of the floating gate electrode 501 is set higher than that of the drain region 202, is larger than that applied between the floating gate electrode 501 and the drain region 202 for ejecting electrons to the drain region 202 from the gate electrode 501 at the time of program/erase.

The difference in voltages between the electron injection into the gate electrode 501 from the drain region 202 and the electron ejection from the floating gate electrode 501 to the drain region 202 comes from the difference in routes for the applied voltages. Since the programming voltage to the drain region passes through a select gate transistor for selecting a memory cell to which the data is reprogrammed in the case of electron ejection from the floating gate electrode 501 to the drain region 202, the voltage actually applied to the drain region is thus lowered by an amount equal to an increase in the threshold voltage of the select gate transistor caused by a back gate bias.

In the embodiment shown by FIG. 3 generation of the unbalanced stress to the tunnel insulating film assigned to inject electrons to the floating gate electrode 501 can be prevented to suppress degradation by making the area of the tunnel insulating film 401 for injecting electrons formed on the surface of the N-type low-impurity-concentration region 961 larger than that of the tunnel insulating film 402 for ejecting electrons formed on the surface of the P-type low-impurity-concentration region 962.

In the embodiment shown by FIG. 3 the area of the tunnel insulating film 401 for injecting electrons formed on the surface of the N-type low-impurity-concentration region 961 is illustrated to be larger than that of the tunnel insulating film 402 for ejecting electrons formed on the surface of the P-type low-impurity-concentration region 962. It is, however, preferable to set the same tunnel current per unit area for both the tunnel insulating film 401 for injecting electrons and the tunnel insulating film 402 for ejecting electrons by assigning an area ratio between them according to the difference between the voltages for injecting electrons into the gate electrode 501 from the drain region 202 and for ejecting electrons to the drain region 202 from the gate electrode 501. Explanation for other part of the structure having the same numeral as in FIG. 1 is omitted.

4. Fourth Embodiment

Figure 4:
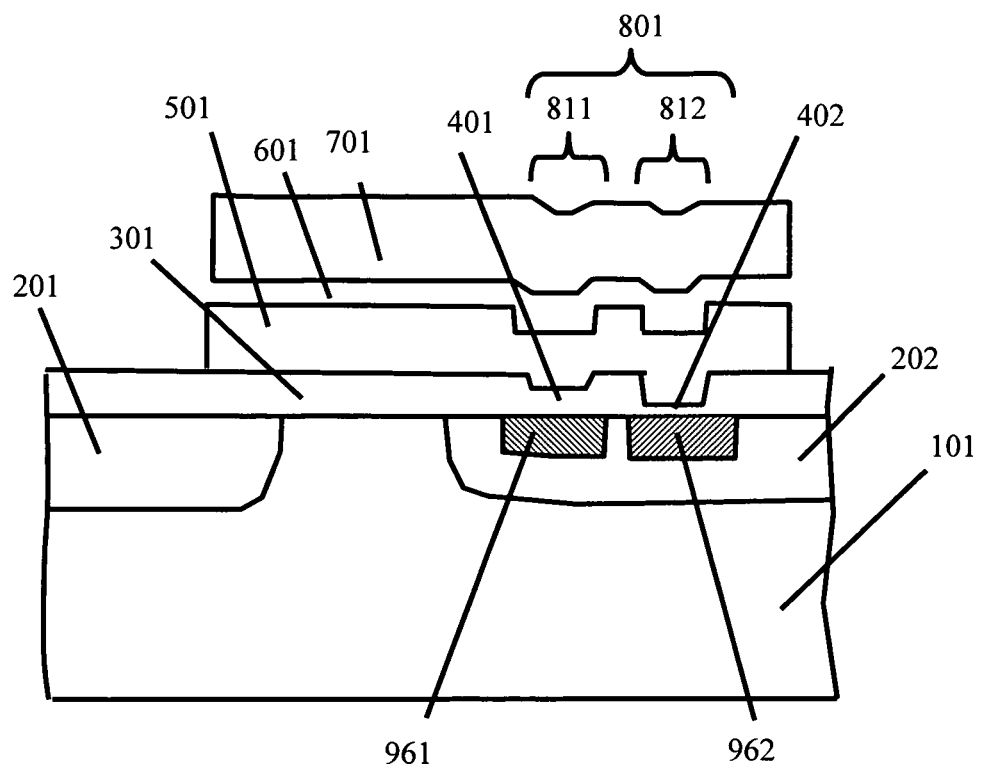
FIG. 4 shows a cross-sectional view illustrating the fourth embodiment of an electrically erasable and programmable nonvolatile semiconductor memory device according to the present invention.

FIG. 4 shows a cross-sectional view illustrating the fourth embodiment of an electrically erasable and programmable nonvolatile semiconductor memory device according to the present invention.

Difference to the first embodiment shown by FIG. 1 is that the thickness of the tunnel insulating film 401 for injecting electrons formed on the surface of the N-type low-impurity-concentration region 961 is thicker than that of the tunnel insulating film 402 for ejecting electrons formed on the surface of the P-type low-impurity-concentration region 962. The size of the injection region 811 and the ejection region 912 are the same.

As explained in the third embodiment, the voltage applied between the floating gate electrode 501 and the drain region 202 for injecting electrons into the gate electrode 501 from the drain region 202, in which the potential of the floating gate electrode 501 is set higher than that of the drain region 202, is larger than that applied between the floating gate electrode 501 and the drain region 202 for ejecting electrons to the drain region 202 from the gate electrode 501 at the time of program/erase.

In the embodiment shown by FIG. 4 generation of the unbalanced stress to the tunnel insulating film assigned to inject electrons to the floating gate electrode 501 can be prevented to suppress degradation by making the thickness of the tunnel insulating film 401 for injecting electrons formed on the surface of the N-type low-impurity-concentration region 961 thicker than that of the tunnel insulating film 402 for ejecting electrons formed on the surface of the P-type low-impurity-concentration region 962.

In the embodiment shown by FIG. 4 the thickness of the tunnel insulating film 401 for injecting electrons formed on the surface of the N-type low-impurity-concentration region 961 is illustrated to be thicker than that of the tunnel insulating film 402 for ejecting electrons formed on the surface of the P-type low-impurity-concentration region 962. It is, however, preferable to set the same current density for both the tunnel insulating film 401 for injecting electrons and the tunnel insulating film 402 for ejecting electrons by assigning a thickness ratio between them according to the difference between the voltages for injecting electrons into the gate electrode 501 from the drain region 202 and for ejecting electrons to the drain region 202 from the gate electrode 501. Explanation for other part of the structure having the same numeral as in FIG. 1 is omitted.

5. Fifth Embodiment

Figure 5:
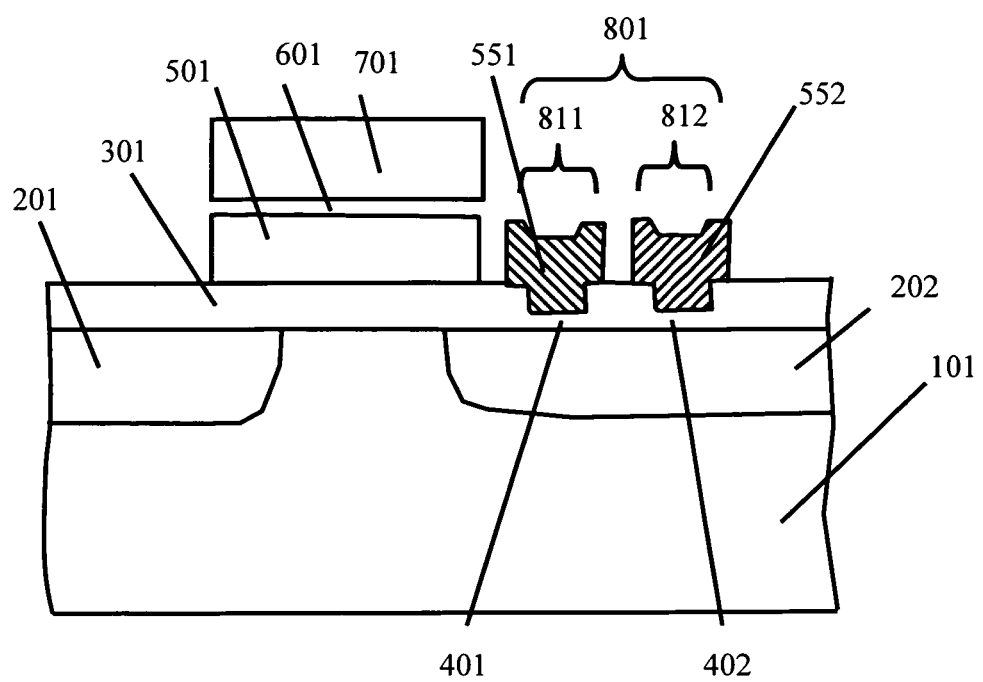
FIG. 5 shows a cross-sectional view illustrating the fifth embodiment of an electrically erasable and programmable nonvolatile semiconductor memory device according to the present invention.

FIG. 5 shows a cross-sectional view illustrating the fifth embodiment of an electrically erasable and programmable nonvolatile semiconductor memory device according to the present invention; a source region 201 and a drain region 202 of the second conductivity-type, which is N-type in this case, are formed apart to face each other on a surface of the semiconductor substrate of the first conductivity-type, which is P-type in this case, to define a channel region on the surface of the semiconductor substrate between the source region and the drain region; a floating gate electrode 501, which is formed from polycrystalline silicon or the like, is disposed on a gate insulating film 301, which is formed, for example, from silicon oxide film and having a thickness of 400 angstrom, over the source region, the drain region and the channel region; a control gate electrode 701, which is formed from polycrystalline silicon or the like, is disposed on a control insulating film, which is formed from a silicon oxide film, a silicon nitride film or a complex film of these films, over the floating gate electrode 501 to have a capacitive coupling with it.

On the surface of the tunnel region 801 in the drain region 202 a tunnel insulating film 401 and a tunnel insulating film 402, both of which are made from a silicon oxide film, a silicon nitride film or a complex film of these films and having a thickness of about 80 angstrom, are formed apart respectively. A P-type low-impurity-concentration floating gate electrode 551 and an N-type low-impurity-concentration floating gate electrode 552, both of which are made from polycrystalline silicon or the like, are formed on the tunnel insulating film 401 and the tunnel insulating film 402 respectively, and electrically connected by polycrystalline silicon or other interconnecting material to have nearly the same potential. Further they are connected to the floating gate electrode 501 by a polycrystalline silicon portion extended from the floating gate electrode 501 or the like to have nearly the same potential among the three. The P-type low-impurity-concentration floating gate electrode 551, the tunnel insulating film 401 beneath and a portion of the drain region define an injection region 811; the N-type low-impurity-concentration floating gate electrode 552, the tunnel insulating film 402 beneath and a portion of the drain region define an ejection region 812.

Both the P-type low-impurity-concentration floating gate electrode 551 and the N-type low-impurity-concentration floating gate electrode 552 have an impurity concentration of not more than $10^{16}$ atoms/cm$^3$. Further at least one of the insulating films: the tunnel insulating film 401 for injecting electrons; the tunnel insulating film 402 for ejecting electrons; and the control insulating film 601, is made from a silicon oxide film, a silicon nitride film or a complex film of these films.

6. Sixth Embodiment

Figure 6:
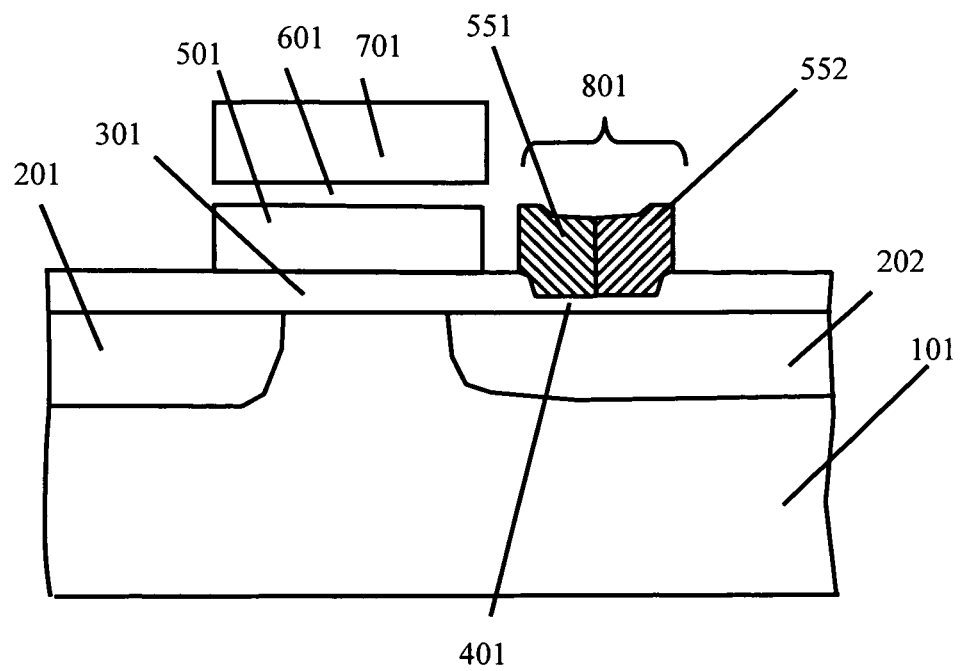
FIG. 6 shows a cross-sectional view illustrating the sixth embodiment of an electrically erasable and programmable nonvolatile semiconductor memory device according to the present invention.

FIG. 6 shows a cross-sectional view illustrating the fourth embodiment of an electrically erasable and programmable nonvolatile semiconductor memory device according to the present invention.

Difference to the fifth embodiment shown by FIG. 5 is that the P-type low-impurity-concentration floating gate electrode 551 and the N-type low-impurity-concentration floating gate electrode 552 are placed adjacent to each other on a tunnel insulating film 401 continuously formed as one piece, which enables reduction of the occupation area. Explanation for other part of the structure having the same numeral as in FIG. 5 is omitted.

7. Seventh Embodiment

Figure 7:
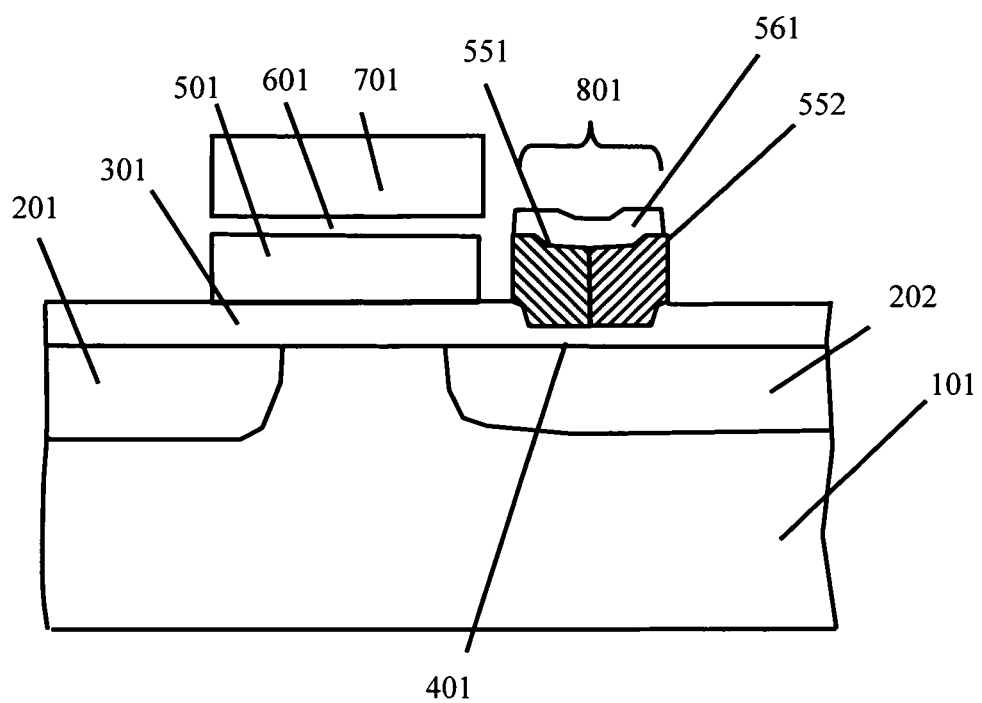
FIG. 7 shows a cross-sectional view illustrating the seventh embodiment of an electrically erasable and programmable nonvolatile semiconductor memory device according to the present invention.

FIG. 7 shows a cross-sectional view illustrating the fourth embodiment of an electrically erasable and programmable nonvolatile semiconductor memory device according to the present invention.

Difference to the sixth embodiment shown by FIG. 6 is that the P-type low-impurity-concentration floating gate electrode 551 and the N-type low-impurity-concentration floating gate electrode 552 are electrically connected by a silicide region 561 to hold them at nearly the same potential, which enables the connection not only between the P-type low-impurity-concentration floating gate electrode 551 and the N-type low-impurity-concentration floating gate electrode 552 bur also with the floating gate electrode 501 at the same potential with a low resistance. Explanation for other part of the structure having the same numeral as in FIGS. 5 and 6 is omitted.

As explained above degradation of the tunnel insulating film, which gives marked effect to the endurance and retention characteristics of an electrically erasable and programmable nonvolatile semiconductor memory device is suppressed, permitting realization of a highly reliable electrically erasable and programmable nonvolatile semiconductor memory device.

What is claimed is:

1. An electrically erasable and programmable nonvolatile semiconductor memory device, comprising:
   a first conductivity-type semiconductor substrate;
   a second conductivity-type source region and a drain region disposed apart to face each other on a surface of the semiconductor substrate;
   a channel formation region sandwiched by the source region and the drain region, formed on the surface of the semiconductor substrate;
   a floating gate electrode disposed on a gate insulating film over the source region, the drain region and the channel region;
   a control gate electrode disposed on a control insulating film over the floating gate electrode and capacitively coupled to the floating gate electrode; and
   an injection region for solely injecting electrons into the floating gate electrode from the drain region and an ejection region for solely ejecting electrons from the floating gate electrode to the drain region, both disposed between the floating gate electrode and the drain region, each of the injection region and the ejection region having a tunnel insulating film, the injection region and the ejection region being distinguished by having a region of a different conductivity-type in a part of one of the floating gate electrode and the drain region.

2. An electrically erasable and programmable nonvolatile semiconductor memory device according to claim 1; wherein the injection region has a second conductivity-type low-impurity-concentration region disposed on the drain region, fixed to the same potential as the drain region, having a lower impurity concentration than that of the drain region and a first tunnel insulating film disposed thereon, and the ejection region has a first conductivity-type low-impurity-concentration region disposed on the drain region, fixed to the same potential as the drain region, having a lower impurity concentration than that of the drain region and a second tunnel insulating film disposed thereon.

3. An electrically erasable and programmable nonvolatile semiconductor memory device according to claim 2; wherein the second conductivity-type low-impurity-concentration region and the first conductivity-type low-impurity-concentration region are disposed apart, and the first tunnel insulating film and the second tunnel insulating film are disposed on the second conductivity-type low-impurity-concentration region and the first conductivity-type low-impurity-concentration region respectively.

4. An electrically erasable and programmable nonvolatile semiconductor memory device according to claim 2; wherein the second conductivity-type low-impurity-concentration region and the first conductivity-type low-impurity-concentration region are disposed adjacent to each other, and the first tunnel insulating film and the second tunnel insulating film are formed continuously as one peace extending over the second conductivity-type low-impurity-concentration region and the first conductivity-type low-impurity-concentration region.

5. An electrically erasable and programmable nonvolatile semiconductor memory device according to claim 2; wherein each of the second conductivity-type low-impurity-concentration region and the first conductivity-type low-impurity-concentration region has an impurity concentration not more than $10^{16}$ atoms/cm$^3$.

6. An electrically erasable and programmable nonvolatile semiconductor memory device according to claim 1; wherein at least one of the first tunnel insulating film, the second tunnel insulating film and the control insulating film is a complex film of a silicon oxide film and a silicon nitride film.

7. An electrically erasable and programmable nonvolatile semiconductor memory device according to claim 2; wherein an area of the tunnel insulating film for injecting electrons on the second conductivity-type low-impurity-concentration region is larger than that of the tunnel insulating film for ejecting electrons formed on the first conductivity-type low-impurity-concentration region.

8. An electrically erasable and programmable nonvolatile semiconductor memory device according to claim 2; wherein the area of the tunnel insulating film disposed on the second conductivity-type low-impurity-concentration region and the area of the tunnel insulating film disposed on the first conductivity-type low-impurity-concentration region are defined to have a same tunnel current per unit area during injecting electrons and ejecting electrons respectively.

9. An electrically erasable and programmable nonvolatile semiconductor memory device according to claim 2; wherein an thickness of the tunnel insulating film for injecting electrons on the second conductivity-type low-impurity-concentration region is thicker than that of the tunnel insulating film for ejecting electrons formed on the first conductivity-type low-impurity-concentration region.

10. An electrically erasable and programmable nonvolatile semiconductor memory device according to claim 2; wherein the thickness of the tunnel insulating film disposed on the second conductivity-type low-impurity-concentration region and the thickness of the tunnel insulating film disposed on the first conductivity-type low-impurity-concentration region are defined to have a same tunnel current per unit area during injecting electrons and ejecting electrons respectively.

11. An electrically erasable and programmable nonvolatile semiconductor memory device according to claim 1; wherein the injection region has a first conductivity-type low-impurity-concentration floating gate electrode electrically connected to the floating gate electrode and a first tunnel insulating film disposed beneath, and the ejection region has a second conductivity-type low-impurity-concentration floating gate electrode electrically connected to the floating gate electrode and a second tunnel insulating film disposed beneath.

12. An electrically erasable and programmable nonvolatile semiconductor memory device according to claim 11; wherein the first conductivity-type low-impurity-concentration floating gate electrode and the second conductivity-type low-impurity-concentration floating gate electrode are disposed apart on the first tunnel insulating film and the second tunnel insulating film which are disposed apart, respectively.

13. An electrically erasable and programmable nonvolatile semiconductor memory device according to claim 11; wherein the first conductivity-type low-impurity-concentration floating gate electrode and the second conductivity-type low-impurity-concentration floating gate electrode are disposed adjacent to each other on a single tunnel insulating film continuously formed from the first tunnel insulating film and the second tunnel insulating film.

14. An electrically erasable and programmable nonvolatile semiconductor memory device according to claim 11; wherein each of the first conductivity-type low-impurity-concentration floating gate electrode and the second conductivity-type low-impurity-concentration floating gate electrode has an impurity concentration not more than $10^{16}$ atoms/cm$^3$.

15. An electrically erasable and programmable nonvolatile semiconductor memory device according to claim 11; wherein the first conductivity-type low-impurity-concentration floating gate electrode and the second conductivity-type low-impurity-concentration floating gate electrode are connected electrically by a silicide region to have a same potential.

16. An electrically erasable and programmable nonvolatile semiconductor memory device according to claim 11; wherein at least one of the first tunnel insulating film, the second tunnel insulating film and the control insulating film is a complex film of a silicon oxide film and a silicon nitride film.

* * * * *